US011139316B2

(12) United States Patent
Tian et al.

(10) Patent No.: US 11,139,316 B2
(45) Date of Patent: Oct. 5, 2021

(54) LTPS ARRAY SUBSTRATE AND METHOD FOR MANUFACTURING SAME

(71) Applicant: WUHAN CHINA STAR OPTOELECTRONICS TECHNOLOGY CO., LTD., Hubei (CN)

(72) Inventors: Chao Tian, Hubei (CN); Juncheng Xiao, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 503 days.

(21) Appl. No.: 16/097,917

(22) PCT Filed: Aug. 1, 2018

(86) PCT No.: PCT/CN2018/097947
§ 371 (c)(1),
(2) Date: Oct. 31, 2018

(87) PCT Pub. No.: WO2019/210594
PCT Pub. Date: Nov. 7, 2019

(65) Prior Publication Data
US 2021/0225883 A1    Jul. 22, 2021

(30) Foreign Application Priority Data

May 4, 2018 (CN) .......................... 201810420727.3

(51) Int. Cl.
*H01L 27/12* (2006.01)

(52) U.S. Cl.
CPC ........ *H01L 27/1222* (2013.01); *H01L 27/127* (2013.01); *H01L 27/1237* (2013.01); *H01L 27/1288* (2013.01)

(58) Field of Classification Search
CPC ............. H01L 27/1222; H01L 27/1237; H01L 27/1288; H01L 27/127
(Continued)

(56) References Cited

U.S. PATENT DOCUMENTS

2001/0048107 A1*  12/2001  Lyu .......................... H01L 27/12
                                                      257/72
2004/0232424 A1*  11/2004  Hotta ................ H01L 29/42384
                                                      257/72
(Continued)

FOREIGN PATENT DOCUMENTS

CN       104701254 A       6/2015
CN       104716144 A       6/2015
(Continued)

*Primary Examiner* — Duy T Nguyen

(57) ABSTRACT

The present disclosure provides an LTPS array substrate and a method for manufacturing the same. The method includes forming a polysilicon pattern by a first mask process; performing a doping treatment on the polysilicon pattern and forming a gate electrode by a second mask process; forming a source electrode through-hole and a drain electrode through-hole and a pixel electrode by a third mask process; forming a source electrode and a drain electrode and a touch control signal line by a fourth mask process; forming a touch control electrode through-hole by a fifth mask process; and forming a touch control electrode by a sixth mask process.

10 Claims, 5 Drawing Sheets

(58) Field of Classification Search
USPC .......................................................... 438/149
See application file for complete search history.

(56) References Cited

U.S. PATENT DOCUMENTS

| | | |
|---|---|---|
| 2014/0151688 A1 | 6/2014 | Yamazaki |
| 2016/0071891 A1* | 3/2016 | Oh ...................... H01L 27/1262 |
| | | 257/72 |
| 2016/0247936 A1* | 8/2016 | Yu ....................... H01L 21/2855 |
| 2016/0254368 A1* | 9/2016 | Jiang ................. H01L 21/28088 |
| | | 257/72 |
| 2016/0328058 A1 | 11/2016 | Peng |
| 2016/0349559 A1* | 12/2016 | Woo ..................... G02F 1/13338 |
| 2017/0045984 A1 | 2/2017 | Lu et al. |
| 2017/0147121 A1* | 5/2017 | Yang ................... H01L 27/3246 |
| 2018/0069034 A1* | 3/2018 | He ....................... H01L 27/1285 |
| 2018/0120607 A1* | 5/2018 | Li ....................... G02F 1/13338 |
| 2018/0122957 A1 | 5/2018 | Lu |

FOREIGN PATENT DOCUMENTS

| | | |
|---|---|---|
| CN | 104777692 A | 7/2015 |
| CN | 105116585 A | 12/2015 |

* cited by examiner

LTPS ARRAY SUBSTRATE AND METHOD FOR MANUFACTURING SAME

FIELD OF INVENTION

The present disclosure relates to the field of array substrate technology, and more particularly to an LTPS type array substrate and a method for manufacturing the same.

BACKGROUND

Low temperature polysilicon (LTPS) has advantage of high electron mobility, which effectively helps reduce an area of a thin film transistor (TFT), and thus increases pixel aperture ratio of display panels. Power consumption of panels is reduced, while brightness of display panels is increased. This is helpful in decreasing manufacturing costs of panels as well. Therefore, LTPS and method for manufacturing the same have become one of the mainstream techniques used for liquid crystal display field.

However, conventional methods for manufacturing LTPS are complicated. There are many film layers formed on an array substrate. Many different mask processes are needed to form these films. For example, different mask processes are required for formation of source/drain electrode through-hole and for formation of pixel electrode. This reduces mask usage efficiency, and many masks are required in manufacturing a panel. In addition, this will not only prolong display panel manufacturing time, but also result in high mask and raw material cost and high operation cost for formation thereof. For this reason, panel manufacturers endeavor to shorten array substrate manufacturing periods, increase product manufacturing yields, increase product manufacturing efficiency, and decrease product manufacturing costs, so as to compete with other competitors.

Therefore, there is a need to provide a method for manufacturing an LTPS array substrate, so as to solve the problems encountered in the prior art.

SUMMARY OF DISCLOSURE

The present disclosure provides an LTPS array substrate and a method for manufacturing the same, which reduces mask cost, operation cost, raw material cost, and time cost. Moreover, an in-cell touch control structure can be formed without use of additional masks.

To solve the aforementioned problems, the present disclosure provides the following technical schemes.

The present disclosure provides a method for manufacturing a low temperature poly silicon (LTPS) array substrate, comprising:

a step S1 of providing a substrate, forming a buffer layer and a polysilicon layer in turn on the substrate, and forming a polysilicon pattern by a first mask process;

a step S2 of forming a gate insulating layer, a gate metal layer and a first photoresist layer in turn on the substrate, etching the gate metal layer to form a gate electrode, and performing a doping treatment on the polysilicon pattern to form a heavily doped portion and a lightly doped portion of the polysilicon pattern;

a step S3 of forming an interlayer insulating layer, a pixel electrode layer, and a second photoresist layer in turn on the substrate, performing an exposure treatment on different areas of the second photoresist layer with different exposure doses by a third mask process, and performing a development treatment on the second photoresist layer to completely remove a portion of the second photoresist layer corresponding to the heavily doped portion and thus form a second photoresist layer pattern having different thicknesses;

a step S4 of etching the pixel electrode layer, the interlayer insulating layer and the gate insulating layer corresponding to the heavily doped portion to form a source electrode through-hole and a drain electrode through-hole; and a step S5 of removing a portion of the second photoresist layer, such that another portion of the second photoresist layer that is disposed above the pixel electrode layer where a pixel electrode is to be formed is retained, and etching the pixel electrode layer to form the pixel electrode.

In accordance with one preferred embodiment of the present disclosure, the method further comprises:

a step S6 of forming a source/drain electrode metal layer on the substrate, and performing a fourth mask process that patterns the source/drain electrode metal layer to from a source electrode and a drain electrode corresponding to the source electrode through-hole and the drain electrode through-hole, respectively, and to form a touch control signal line at a position between two adjacent polysilicon patterns, wherein the drain electrode contacts the pixel electrode;

a step S7 of forming a passivation layer on the substrate, and forming a first through-hole corresponding to the touch control signal line in the passivation layer by a fifth mask process;

a step S8 of forming a touch control electrode layer on the substrate, and performing a sixth mask process that patterns the touch control electrode layer to form a touch control electrode, wherein the touch control electrode contacts the touch control signal line via the first through-hole.

In accordance with one preferred embodiment of the present disclosure, the step S2 comprises: forming the gate insulating layer, the gate metal layer and the first photoresist layer in turn on the substrate; and performing a second mask process that first etch the gate metal layer to form the heavily doped portion of the polysilicon pattern and then further etch the gate metal layer to form the gate electrode and the lightly doped portion of the polysilicon pattern, wherein the heavily doped portion is formed by performing an N+ ion implantation on the polysilicon pattern using a gate metal layer pattern generated after first etching of the gate metal layer as a mask, and the lightly doped portion is formed by performing an N− ion implantation on the polysilicon pattern using the gate electrode as a mask.

In accordance with one preferred embodiment of the present disclosure, the heavily doped portion includes a first heavily doped portion and a second heavily doped portion disposed to correspond to two sides of a gate metal layer pattern generated after first etching of the gate metal layer, and the lightly doped portion includes a first lightly doped portion and a second lightly doped portion disposed to correspond to two sides of the gate electrode, a width of the first heavily doped portion is same as a width of the second heavily doped portion, and a width of the first lightly doped portion is same as a width of the second lightly doped portion.

In accordance with one preferred embodiment of the present disclosure, in the step S3, the second photoresist layer pattern disposed above and corresponding to the pixel electrode has a greatest thickness.

In accordance with one preferred embodiment of the present disclosure, the step S4 comprises:

a step S41 of performing a first etching treatment to remove the pixel electrode layer corresponding to the heavily doped portion; and a step S42 of performing a second etching treatment to remove the interlayer insulating layer and the gate insulating layer corresponding to the heavily doped portion, so as to form the source electrode through-hole corresponding to a source electrode and the drain electrode through-hole corresponding to a drain electrode.

In accordance with one preferred embodiment of the present disclosure, the step S5 comprises:

a step S51 of etching the second photoresist layer pattern while retaining the second photoresist layer disposed above the pixel electrode;

a step S52 of etching the pixel electrode layer to form the pixel electrode; and a step S53 of removing the second photoresist layer disposed above the pixel electrode.

In accordance with one preferred embodiment of the present disclosure, a portion of the drain electrode is formed above the pixel electrode.

In accordance with one preferred embodiment of the present disclosure, both of the pixel electrode layer and the touch control electrode layer are made of indium tin oxide.

In addition, the present disclosure provides a low temperature poly silicon (LTPS) array substrate manufactured according to the aforementioned method.

Furthermore, the present disclosure provides a low temperature poly silicon (LTPS) array substrate, comprising:

a substrate;

a polysilicon layer disposed on the substrate;

a gate electrode disposed to correspond to and insulated from the polysilicon layer;

an interlayer insulating layer disposed on the gate electrode;

a pixel electrode disposed on the interlayer insulating layer;

a source electrode disposed on the interlayer insulating layer, wherein the source electrode is electrically connected to one end of the polysilicon layer via a source electrode through-hole;

a drain electrode disposed on the interlayer insulating layer, wherein the drain electrode is electrically connected to the other end of the polysilicon layer via a drain electrode through-hole, and is electrically connected to the pixel electrode; and a touch control electrode disposed on and insulated from the pixel electrode, wherein two adjacent touch control electrodes are connected to each other via a first through-hole by a touch control signal line;

wherein the source electrode through-hole, the drain electrode through-hole and the pixel electrode are formed in a same mask process; and the source electrode, the drain electrode and the touch control signal line are formed in another same mask process.

The present disclosure provides an LTPS array substrate and a method for manufacturing the same. A doping treatment is performed on the polysilicon pattern using the gate electrode as a mask, therefore masks used for forming lightly doped portion and heavily doped portion are omitted. In addition, the source electrode through-hole, the drain electrode through-hole, and the pixel electrode are formed in the same mask process. Formation of multi film structure can be achieved by a single one mask process, maximizing mask usage efficiency. According to the present disclosure, only six masks are required to manufacture an LTPS array substrate. Compared to the conventional method, the present disclosure is characterized in significantly simplifying the manufacturing process and thus reducing quantity of masks used in the process, therefore mask cost, operation cost, raw material cost, and time cost are reduced.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
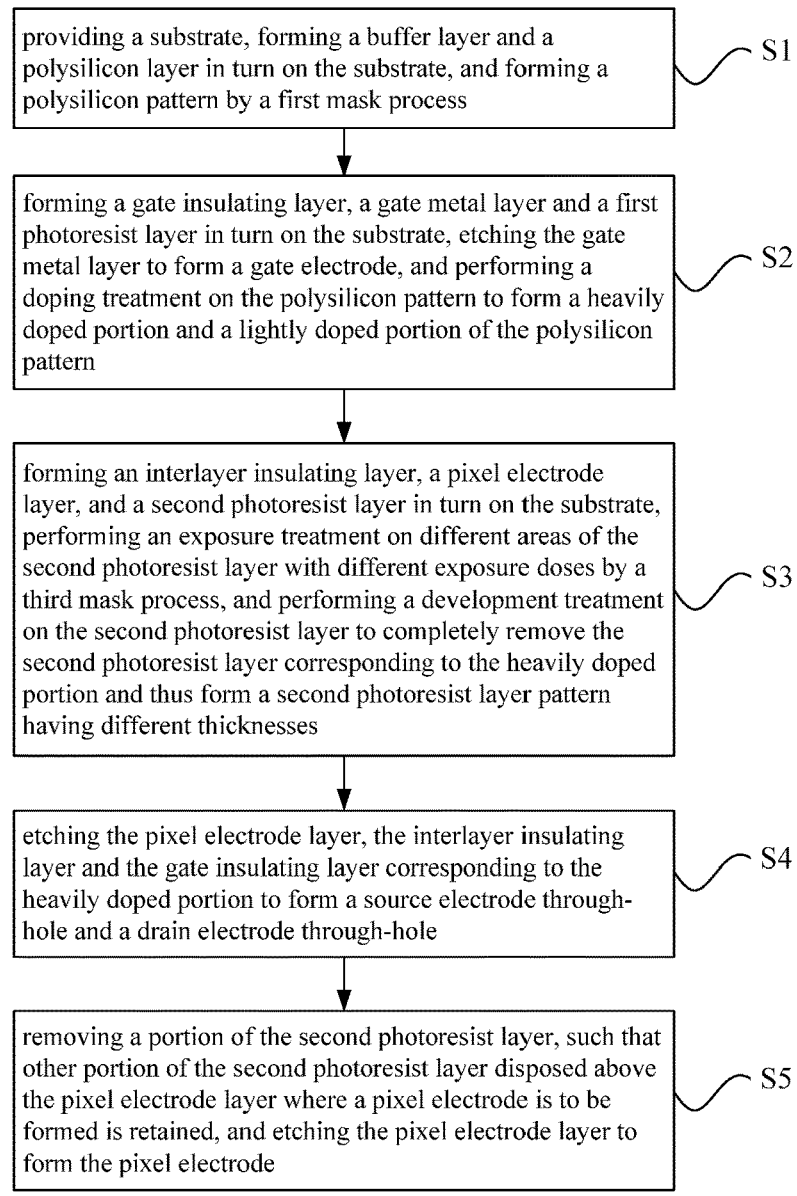
FIG. 1 shows a flowchart of a method for manufacturing an LTPS array substrate according to one embodiment of the present disclosure.

The following embodiments refer to the accompanying drawings for exemplifying specific implementable embodiments of the present disclosure. Moreover, directional terms described by the present disclosure, such as upper, lower, front, back, le, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure solves the problems encountered in the conventional method for manufacturing a low temperature polysilicon (LTPS) array substrate, where the conventional method is complicated, requires many of mask processes, prolongs product manufacturing time, increases mask and raw material cost, and increases operation cost.

Please refer to FIG. 1, which shows a flowchart of a method for manufacturing an LTPS array substrate according to one embodiment of the present disclosure. The method includes:

a step S1 of providing a substrate, forming a buffer layer and a polysilicon layer in turn on the substrate, and forming a polysilicon pattern by a first mask process;

a step S2 of forming a gate insulating layer, a gate metal layer and a first photoresist layer in turn on the substrate, etching the gate metal layer to form a gate electrode, and performing a doping treatment on the polysilicon pattern to form a heavily doped portion and a lightly doped portion of the polysilicon pattern;

a step S3 of forming an interlayer insulating layer, a pixel electrode layer and a second photoresist layer in turn on the substrate, performing an exposure treatment on different areas of the second photoresist layer with different exposure doses by a third mask process, and performing a development treatment on the second photoresist layer to completely remove the second photoresist layer corresponding to the heavily doped portion and thus form a second photoresist layer pattern having different thicknesses;

a step S4 of etching the pixel electrode layer, the interlayer insulating layer and the gate insulating layer corresponding to the heavily doped portion to form a source electrode through-hole and a drain electrode through-hole; and a step S5 of removing a portion of the second photoresist layer, such that another portion of the second photoresist layer that is disposed above the pixel electrode layer where a pixel electrode is to be formed is retained, and etching the pixel electrode layer to form the pixel electrode.

Figure 2A:
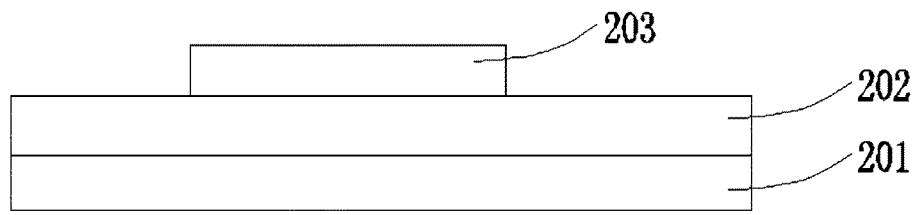
FIGS. 2A, 2B, 2C, 2D, 2E, 2F, 2G, 2H, 2I, 2J, 2K, 2L, and 2M show a process flow of a method for manufacturing an LTPS array substrate according to one embodiment of the present disclosure.

Specifically, please refer FIGS. 2A-2M, which show a process flow of a method for manufacturing an LTPS array substrate according to one embodiment of the present disclosure. As shown in FIG. 2A, a substrate 201 is provided, and a buffer layer 202 and a polysilicon layer are formed in turn on the substrate 201. A polysilicon pattern 203 is formed by a first mask process.

Figure 2B:
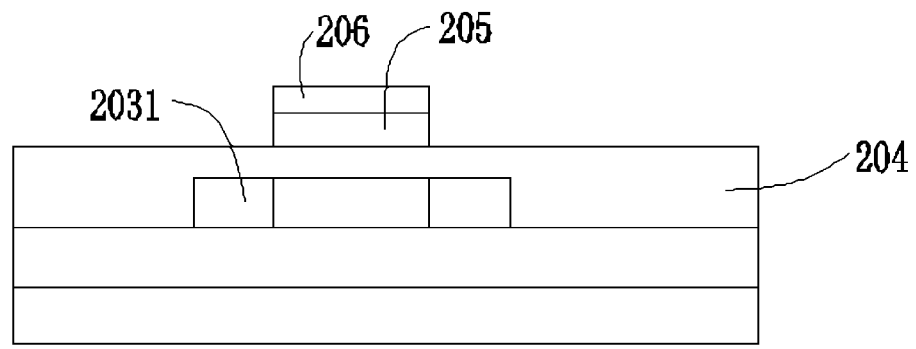

As shown in FIG. 2B, a gate insulating layer 204, a gate metal layer and a first photoresist layer 206 are formed in turn on the substrate 201. The gate metal layer is first etched to forma gate metal layer pattern 205. An N+ ion implantation is performed on the polysilicon pattern 203 using the gate metal layer pattern 205 as a mask, so as to form a heavily doped portion 2031 of the polysilicon pattern 203. The heavily doped portion 2031 includes a first heavily doped portion and a second heavily doped portion disposed to correspond to two sides of the gate metal layer pattern 205, and a width of the first heavily doped portion is same as a width of the second heavily doped portion.

Figure 2C:
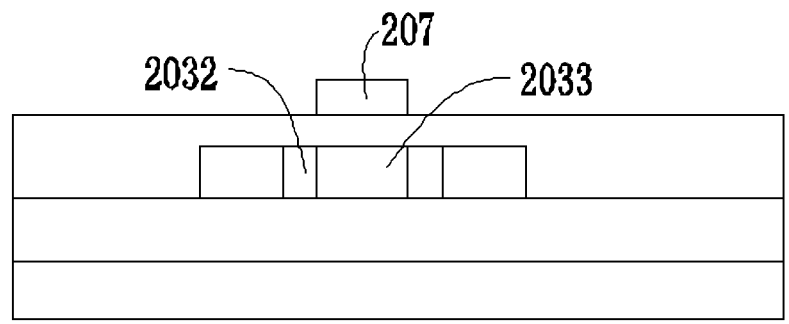

As shown in FIG. 2C, the gate metal layer is further etched to form a gate electrode 207. An N− ion implantation is performed on the polysilicon pattern 203 using the gate electrode 207 as a mask, so as to form a lightly doped portion 2032 of the polysilicon pattern 203. Thus, a polysilicon portion 2033 corresponding to the gate electrode 207 is formed in the polysilicon pattern 203. The lightly doped portion 2032 includes a first lightly doped portion and a second lightly doped portion disposed to correspond to two sides of the gate electrode 207, and a width of the first lightly doped portion is same as a width of the second lightly doped portion. The first lightly doped portion is disposed between the first heavily doped portion and the polysilicon portion 2033, and the second lightly doped portion is disposed between the second heavily doped portion and the polysilicon portion 2033.

Figure 2D:
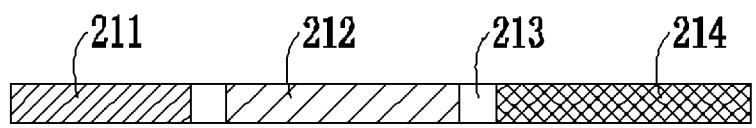
Figure 2D:
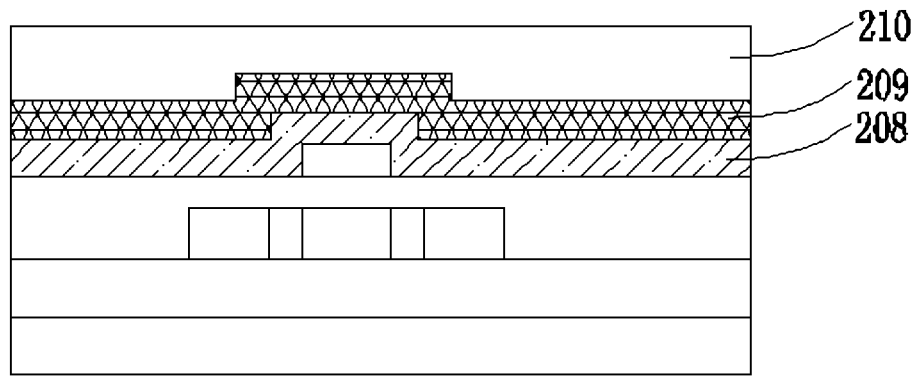

As shown in FIG. 2D, an interlayer insulating layer 208, a pixel electrode layer 209 and a second photoresist layer 210 are formed in turn on the substrate 201. An exposure treatment is performed on different areas of the second photoresist layer 210 with different exposure doses by a third mask process. A first portion 211 and a second portion 211 of the third mask are semi-transparent, a third portion 213 of the third mask is totally transparent, and a fourth portion 214 of the third mask is slightly transparent (almost opaque), such that different exposure doses are generated as the exposure treatment is performed. A development treatment will be performed later on the second photoresist layer 210 to form a second photoresist layer pattern having different thicknesses. Preferably, the second photoresist layer 210 includes a positive type photoresist.

Figure 2E:
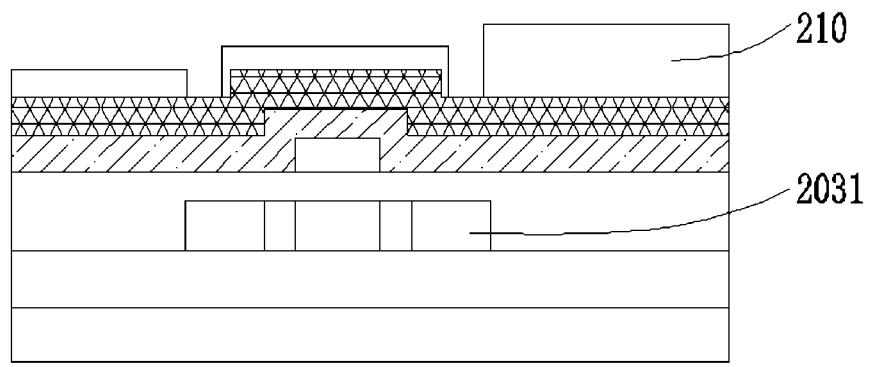

As shown in FIG. 2E, a development treatment is performed on the second photoresist layer 210 to completely remove the second photoresist layer 210 corresponding to the heavily doped portion 2031. The second photoresist layer pattern disposed above and corresponding to the pixel electrode layer 209 where a pixel electrode is to be formed has a greatest thickness.

Figure 2F:
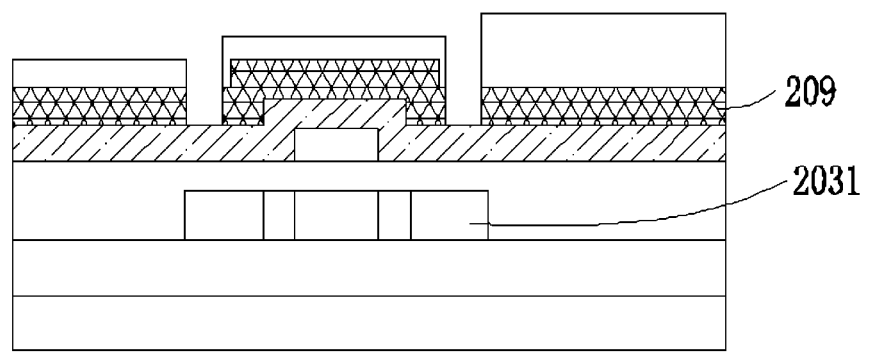

As shown in FIG. 2F, a first etching (wet etching) treatment is performed to remove the pixel electrode layer 209 corresponding to the heavily doped portion 2031. The removed portion of the pixel electrode layer 209 corresponds to the completely removed portion of the second photoresist layer 210.

Figure 2G:
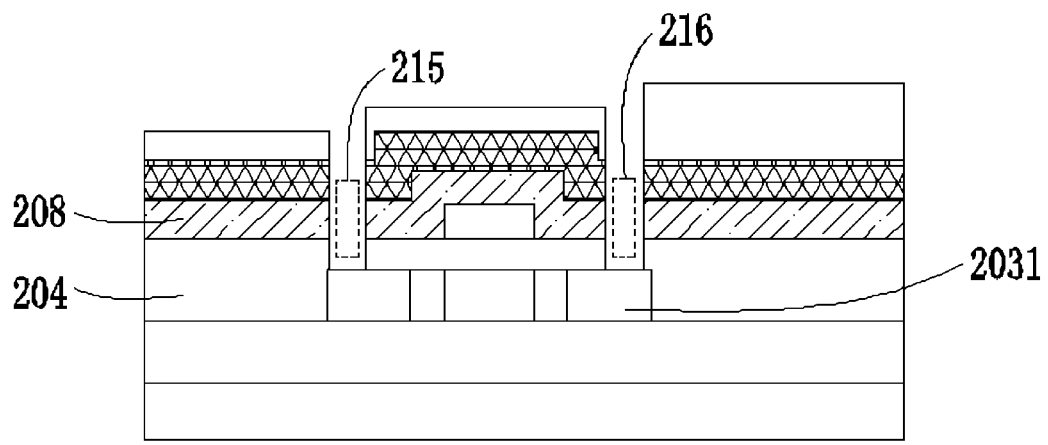

As shown in FIG. 2G, a second etching (dry etching) treatment is further performed to remove the interlayer insulating layer 208 and the gate insulating layer 204 corresponding to the heavily doped portion 2031, thus forming a source electrode through-hole 215 corresponding to a source electrode and a drain electrode through-hole 216 corresponding to a drain electrode.

Figure 2H:
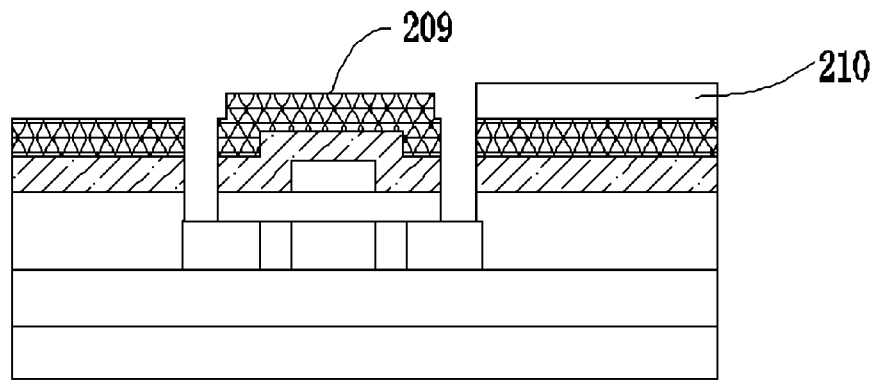
Figure 2I:
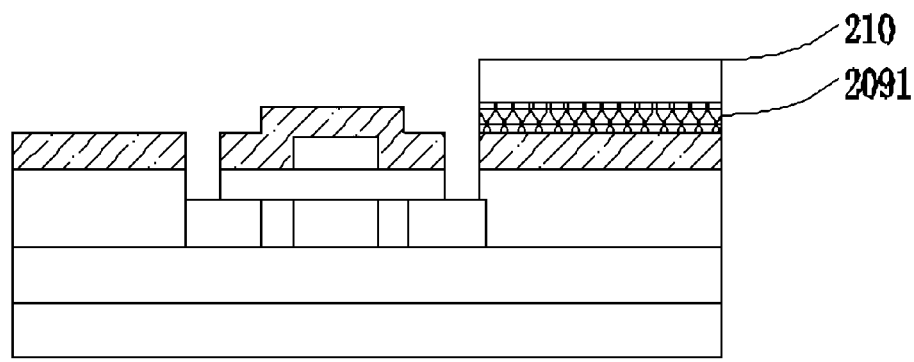
Figure 2J:
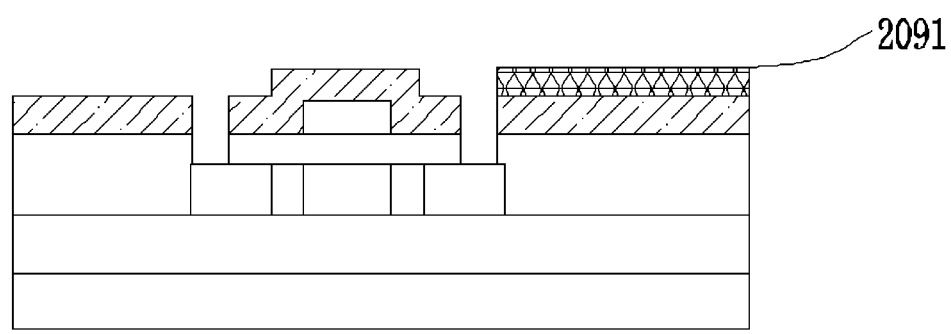

As shown in FIG. 2H, an etching treatment is further performed on the second photoresist layer 210 to retain the portion of the second photoresist layer 210 disposed above the pixel electrode layer 209 where a pixel electrode is to be formed. A wet etching treatment is performed on the pixel electrode layer 209 to remove the portion of the pixel electrode layer 209 that is not covered by the second photoresist layer 210. As shown in FIG. 2I, after the pixel electrode layer 209 is etched, a pixel electrode 2091 is formed. Thereafter, as shown in FIG. 2J, the second photoresist layer 210 disposed above the pixel electrode 2091 is removed. The third mask process thus comes to an end.

Figure 2K:
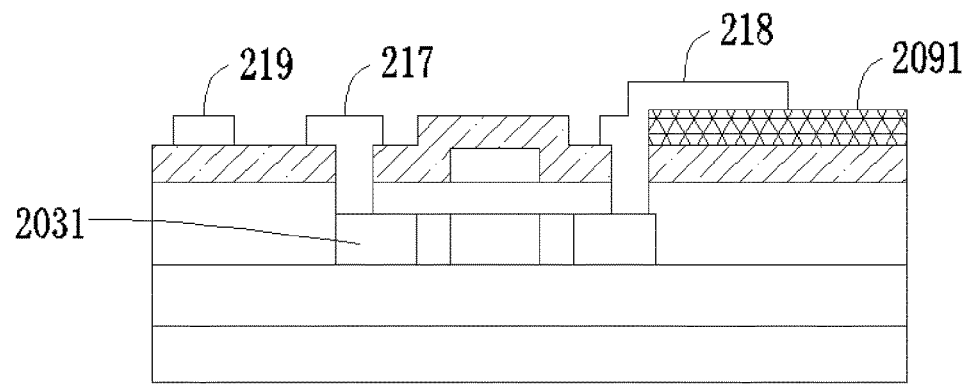

As shown in FIG. 2K, in addition to the aforementioned steps, the method further includes the following steps. A source/drain electrode metal layer is formed on the substrate. A fourth mask process is performed to pattern the source/drain electrode metal layer, so as to from a source electrode 217 and a drain electrode 218 corresponding to the source electrode through-hole 215 and the drain electrode through-hole 216, respectively, and to form a touch control signal line 219 at a position between two adjacent polysilicon patterns. The source electrode 217 and the drain electrode 218 are electrically connected to the heavily doped portion 2031. The touch control signal line 219 is at the same layer as the source electrode 217 and the drain electrode 218, and is insulated from the source electrode 217 and the drain electrode 218. The drain electrode 218 contacts the pixel electrode 2091. A portion of the drain electrode 218 can be formed above the pixel electrode 2091, increasing contact area between the pixel electrode 2091 and the drain electrode 219.

Figure 2L:
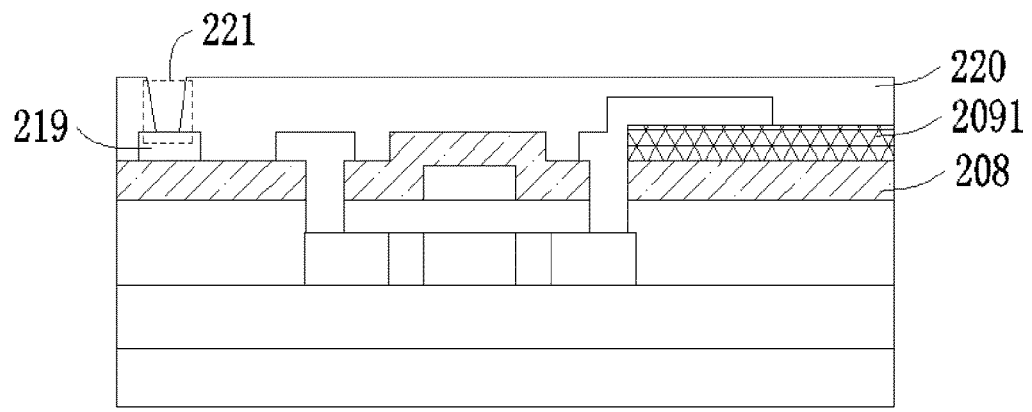

As shown in FIG. 2L, a passivation layer 220 is formed on the interlayer insulating layer 208 and the pixel electrode 2091. A first through-hole 221 corresponding to the touch control signal line 219 is formed in the passivation layer 220 by a fifth mask process.

Figure 2M:
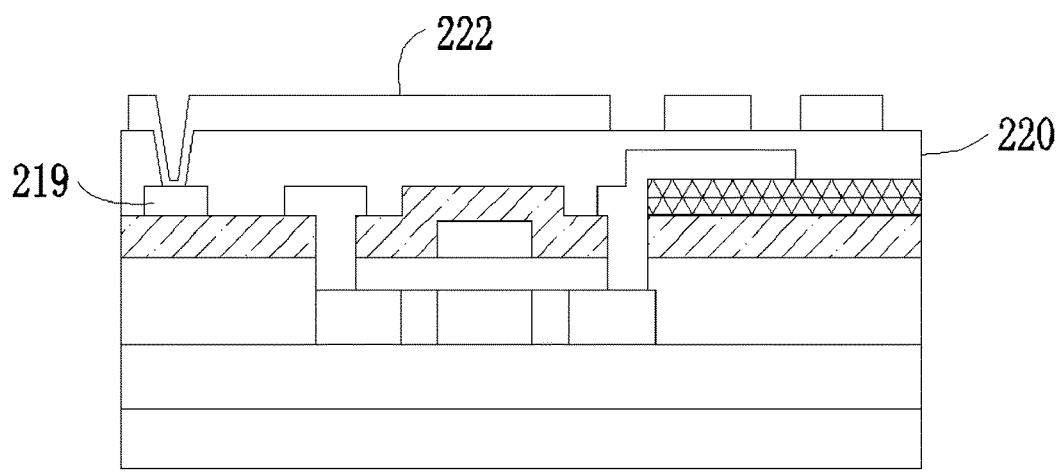

As shown in FIG. 2M, a touch control electrode layer is formed on the passivation layer 220. A sixth mask process is performed to pattern the touch control electrode layer to form a touch control electrode 222, where the touch control electrode 222 contacts the touch control signal line 219 via the first through-hole 221. The touch control electrode 222 is configured for receiving touch control signals, and touch control signals are transmitted to a control end via the touch control signal line 219. Preferably, both of the pixel electrode layer 209 and the touch control electrode layer are made of indium tin oxide.

Additionally, the present disclosure provides an LTPS array substrate manufactured according to the above-said method. The LTPS array substrate includes:

a substrate;

a polysilicon layer disposed on the substrate;

a gate electrode disposed to correspond to and insulated from the polysilicon layer;

an interlayer insulating layer disposed on the gate electrode;

a pixel electrode disposed on the interlayer insulating layer;

a source electrode disposed on the interlayer insulating layer, wherein the source electrode is electrically connected to one end of the polysilicon layer via a source electrode through-hole;

a drain electrode disposed on the interlayer insulating layer, wherein the drain electrode is electrically connected to the other end of the polysilicon layer via a drain electrode through-hole, and is electrically connected to the pixel electrode;

a passivation layer disposed on the pixel electrode;

a touch control electrode disposed on the passivation layer, wherein the touch control electrodes are arranged in an array, and two adjacent touch control electrodes are connected to each other via a first through-hole by a touch control signal line disposed on the interlayer insulating layer;

wherein the source electrode through-hole, the drain electrode through-hole and the pixel electrode are formed in a same mask process; and the source electrode, the drain electrode and the touch control signal line are formed in another same mask process.

Moreover, the present disclosure provides a display panel including an LTPS array substrate manufactured according to the above-said method.

The present disclosure provides an LTPS array substrate and a method for manufacturing the same. A doping treatment is performed on the polysilicon pattern using the gate electrode as a mask, therefore masks used for forming lightly doped portion and heavily doped portion are omitted. In addition, the source electrode through-hole, the drain electrode through-hole, and the pixel electrode are formed in the same mask process. According to the present disclosure, only six masks are required to manufacture an LTPS array substrate. Compared to the conventional method, the present disclosure is characterized in significantly simplifying the manufacturing process and thus reducing quantity of masks used in the process, therefore mask cost, operation cost, raw material cost, and time cost are reduced. Moreover, an in-cell touch control structure can be formed without use of additional masks.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a low temperature poly silicon (LIPS) array substrate, comprising:

a step S1 of providing a substrate, forming a buffer layer and a polysilicon layer in turn on the substrate, and forming a polysilicon pattern by a first mask process;

a step S2 of forming a gate insulating layer, a gate metal layer and a first photoresist layer in turn on the substrate, etching the gate metal layer to form a gate electrode, and performing a doping treatment on the polysilicon pattern to form a heavily doped portion and a lightly doped portion of the polysilicon pattern;

a step S3 of forming an interlayer insulating layer, a pixel electrode layer, and a second photoresist layer in turn on the substrate, performing an exposure treatment on different areas of the second photoresist layer with different exposure doses by a third mask process, and performing a development treatment on the second photoresist layer to completely remove a portion of the second photoresist layer corresponding to the heavily doped portion and thus form a second photoresist layer pattern having different thicknesses;

a step S4 of etching the pixel electrode layer, the interlayer insulating layer and the gate insulating layer corresponding to the heavily doped portion to form a source electrode through-hole and a drain electrode through-hole; and a step S5 of removing a portion of the second photoresist layer, such that another portion of the second photoresist layer that is disposed above the pixel electrode layer where a pixel electrode is to be formed is retained, and etching the pixel electrode layer to form the pixel electrode.

2. The method for manufacturing the LIPS array substrate according to claim 1, further comprising:

a step S6 of forming a source/drain electrode metal layer on the substrate, and performing a fourth mask process that patterns the source/drain electrode metal layer to from a source electrode and a drain electrode corresponding to the source electrode through-hole and the drain electrode through-hole, respectively, and to form a touch control signal line at a position between two adjacent polysilicon patterns, wherein the drain electrode contacts the pixel electrode;

a step S7 of forming a passivation layer on the substrate, and forming a first through-hole corresponding to the touch control signal line in the passivation layer by a fifth mask process;

a step S8 of forming a touch control electrode layer on the substrate, and performing a sixth mask process that patterns the touch control electrode layer to form a touch control electrode, wherein the touch control electrode contacts the touch control signal line via the first through-hole.

3. The method for manufacturing the LTPS array substrate according to claim 2, wherein a portion of the drain electrode is formed above the pixel electrode.

4. The method for manufacturing the LTPS array substrate according to claim 2, wherein both of the pixel electrode layer and the touch control electrode layer are made of indium tin oxide.

5. The method for manufacturing the LTPS array substrate according to claim 1, wherein the step S2 comprises: forming the gate insulating layer, the gate metal layer and the first photoresist layer in turn on the substrate; and performing a second mask process that first etch the gate metal layer to form the heavily doped portion of the polysilicon pattern and then further etch the gate metal layer to form the gate electrode and the lightly doped portion of the polysilicon pattern, wherein the heavily doped portion is formed by performing an $N^+$ ion implantation on the polysilicon pattern using a gate metal layer pattern generated after first etching of the gate metal layer as a mask, and the lightly doped portion is formed by performing an $N^-$ ion implantation on the polysilicon pattern using the gate electrode as a mask.

6. The method for manufacturing the LTPS array substrate according to claim 1, wherein the heavily doped portion includes a first heavily doped portion and a second heavily doped portion disposed to correspond to two sides of a gate metal layer pattern generated after first etching of the gate metal layer, and the lightly doped portion includes a first lightly doped portion and a second lightly doped portion disposed to correspond to two sides of the gate electrode, a width of the first heavily doped portion is same as a width of the second heavily doped portion, and a width of the first lightly doped portion is same as a width of the second lightly doped portion.

7. The method for manufacturing the LTPS array substrate according to claim 1, wherein in the step S3, the second photoresist layer pattern disposed above and corresponding to the pixel electrode has a greatest thickness.

8. The method for manufacturing the LTPS array substrate according to claim 1, wherein the step S4 comprises:
- a step S41 of performing a first etching treatment to remove the pixel electrode layer corresponding to the heavily doped portion; and
- a step S42 of performing a second etching treatment to remove the interlayer insulating layer and the gate insulating layer corresponding to the heavily doped portion, so as to form the source electrode through-hole corresponding to a source electrode and the drain electrode through-hole corresponding to a drain electrode.

9. The method for manufacturing the LTPS array substrate according to claim 1, wherein the step S5 comprises:
- a step S51 of etching the second photoresist layer pattern while retaining the second photoresist layer disposed above the pixel electrode;
- a step S52 of etching the pixel electrode layer to form the pixel electrode; and
- a step S53 of removing the second photoresist layer disposed above the pixel electrode.

10. A low temperature poly silicon (LTPS) array substrate manufactured according to the method of claim 1.

* * * * *